US007007250B1

(12) United States Patent
Bapat et al.

(10) Patent No.: US 7,007,250 B1
(45) Date of Patent: Feb. 28, 2006

(54) APPLICATION-SPECIFIC METHODS USEFUL FOR TESTING LOOK UP TABLES IN PROGRAMMABLE LOGIC DEVICES

(75) Inventors: Shekhar Bapat, Cupertino, CA (US); Robert W. Wells, Cupertino, CA (US); Robert D. Patrie, Scotts Valley, CA (US); Andrew W. Lai, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 412 days.

(21) Appl. No.: 10/388,000

(22) Filed: Mar. 12, 2003

Related U.S. Application Data

(63) Continuation-in-part of application No. 10/104,324, filed on Mar. 22, 2002, now Pat. No. 6,817,006, which is a continuation-in-part of application No. 09/924,365, filed on Aug. 7, 2001, now Pat. No. 6,664,808.

(51) Int. Cl.
*G06F 17/50* (2006.01)
(52) U.S. Cl. .......................... 716/4; 716/16
(58) Field of Classification Search ............ 716/4–5, 716/16–17; 714/725, 733; 326/16, 37–41
See application file for complete search history.

(56) References Cited

U.S. PATENT DOCUMENTS

| | | | |
|---|---|---|---|
| 3,995,261 A | 11/1976 | Goldberg | |
| 4,020,469 A | 4/1977 | Manning | |
| 4,700,187 A | 10/1987 | Furtek | |
| 5,459,342 A | 10/1995 | Nogami et al. | |
| 5,498,975 A | 3/1996 | Cliff et al. | |
| 5,889,413 A | 3/1999 | Bauer | |
| 5,914,616 A | 6/1999 | Young et al. | |
| 6,075,418 A | 6/2000 | Kingsley et al. | |
| 6,128,214 A | 10/2000 | Kuckes et al. | |
| 6,166,559 A | 12/2000 | McClintock et al. | |
| 6,167,558 A * | 12/2000 | Trimberger | 716/16 |
| 6,232,845 B1 | 5/2001 | Kingsley et al. | |
| 6,256,767 B1 | 7/2001 | Kuckes et al. | |
| 6,314,019 B1 | 11/2001 | Kuckes et al. | |
| 6,356,514 B1 | 3/2002 | Wells et al. | |
| 6,427,156 B1 | 7/2002 | Chapman et al. | |
| 6,432,740 B1 | 8/2002 | Chen | |
| 6,459,095 B1 | 10/2002 | Heath et al. | |
| 6,651,225 B1 * | 11/2003 | Lin et al. | 716/4 |

OTHER PUBLICATIONS

U.S. Appl. No. 08/786,818, filed Jan. 21, 1997, Chapman et al.
U.S. Appl. No. 09/837,380, filed Apr. 17, 2001, Wells et al.
U.S. Appl. No. 10/199,535, filed Jul. 18, 2002, Trimberger.

(Continued)

*Primary Examiner*—Paul Dinh
(74) *Attorney, Agent, or Firm*—Arthur Joseph Behiel; Kim Kanzaki

(57) ABSTRACT

Disclosed methods for utilizing programmable logic devices that contain at least one localized defect. Such devices are tested to determine their suitability for implementing selected customer designs that may not require the resources impacted by the defect. If the FPGA is found to be unsuitable for one design, additional designs may be tested. The test methods in some embodiments employ test circuits derived from a user design to verify PLD resources required for the design. The test circuits allow PLD vendors to verify the suitability of a PLD for a given customer design without requiring the vendor to understand the design.

19 Claims, 5 Drawing Sheets

OTHER PUBLICATIONS

U.S. Appl. No. 10/104,324, filed Mar. 22, 2002, Wells et al.
U.S. Appl. No. 09/924,365, filed Aug. 7, 2001, Ling et al.
Xilinx, Inc., Virtex-II 1.5V Field-Programmable Gate Arrays, Nov. 29, 2001, pp. 1-39, DS031-2 (v1.9), available from Xilinx, Inc. 2100 Logic Drive, San Jose, CA., 95124.

Micahel J. S. Smith, "Application-Specific Integrated Circuits" 1997, Ch. 14, pp. 711-804, available from Addison Wesley Longman, Inc. 75 Arlington Street, Suite 300, Boston, MA 02116.

* cited by examiner

APPLICATION-SPECIFIC METHODS USEFUL FOR TESTING LOOK UP TABLES IN PROGRAMMABLE LOGIC DEVICES

PRIORITY

This application is a continuation-in-part of U.S. patent application Ser. No. 10/104,324, now U.S. Pat. No. 6,817,006 entitled "APPLICATION—SPECIFIC TESTING METHODS FOR PROGRAMMABLE LOGIC DEVICES," by Robert W. Wells, et al., filed on Mar. 22, 2002, which is a continuation-in-part of U.S. patent application Ser. No. 09/924,365, now U.S. Pat. No. 6,664,808 entitled "A METHOD OF USING PARTIALLY DEFECTIVE PROGRAMMABLE LOGIC DEVICES" by Zhi-Min Ling et al, filed on Aug. 7, 2001, both of which are incorporated herein by reference.

FIELD OF THE INVENTION

The present invention relates to programmable logic devices, and more particularly to methods for testing and using programmable logic devices that contain minor defects.

BACKGROUND OF THE INVENTION

Programmable logic devices (PLDs), such as field-programmable gate arrays (FPGAs), are user-programmable integrated circuits that can be programmed to implement user-defined logic functions. In a typical architecture, an FPGA includes an array of configurable logic blocks (CLBs) surrounded by programmable input/output blocks (IOBs). A hierarchy of programmable routing resources interconnects the CLBs and IOBs. Loading a configuration bitstream into configuration memory cells of the FPGA customizes these CLBs, IOBs, and programmable routing resources. Additional resources, such as multipliers, memory, and application-specific circuits may also be included.

PLDs are growing ever larger as vendors attempt to satisfy customer demand for PLDs capable of performing ever more complex tasks. Unfortunately, as die size increases, so too does the probability of finding a defect on a given die. The process yield therefore decreases with PLD complexity, making already expensive PLDs still more expensive.

PLDs are not design specific, but instead afford users (e.g., circuit designers) the ability to instantiate an almost unlimited number of circuit variations. Not knowing in advance the purpose to which a given PLD will be dedicated places a heavy burden on the quality and reliability of the PLD because PLD vendors must verify the functionality of any feature that might be used. As a result, PLD manufacturers discard PLDs that include even relatively minor defects.

PLD defects can be categorized in two general areas: gross defects that render the entire PLD useless or unreliable, and localized defects that damage a relatively small percentage of the PLD. It has been found that, for large die, close to two thirds of the die on a given wafer may be discarded because of localized defects. Considering the costs associated with manufacturing large integrated circuits, discarding a significant percentage of PLD die has very significant adverse economic impact on PLD manufacturers.

SUMMARY

The present invention enables PLD manufactures to identify PLDs that, despite some defects, can flawlessly implement selected customer designs.

Subsequent to fabrication, the various die on a given semiconductor wafer are tested for "gross" defects, such as power-supply shorts, that render a PLD unfit for any customer purpose. In a test methodology applicable to SRAM-based FGPAs, die that survive gross testing are subjected to a "readback test" to verify the function of the configuration memory cells. Defect-free die are subjected to further testing to ensure flawless performance, while die that exhibit a large number or dense concentration of readback defects are rejected. Die with relatively few defects are set-aside as "ASIC candidates" and are subjected to further testing. Unlike the general tests normally performed to verify PLD functionality, in one embodiment the ASIC candidates are subjected to application-specific tests that verify the suitability of each candidate to function with one or more specific customer designs.

Some test methods in accordance with embodiments of the invention employ test circuitry derived from a user design to verify PLD resources required for the design. In one type of test, for example, logic blocks required for the user design are programmed to perform the respective logical operations required for the user design. The output terminals of the logic blocks are then observed for each possible combination of input signals to ensure each logic block performs the requisite logical operations. This test can be performed on many logic blocks in parallel.

The test methods and circuits used in accordance with the invention provide excellent fault coverage while allowing test engineers to forego the complex and expensive task of developing design-specific tests. These methods and circuits also narrow test scope to those resources required for a given design, and consequently reduce the time required for test and increase the number of saleable PLDs. Finally, using test circuits other than the user design to test the resources required for the user design facilitates comprehensive testing without requiring an understanding of the user design.

This summary does not limit the scope of the invention, which is instead defined by the claims.

DETAILED DESCRIPTION

Figure 1:
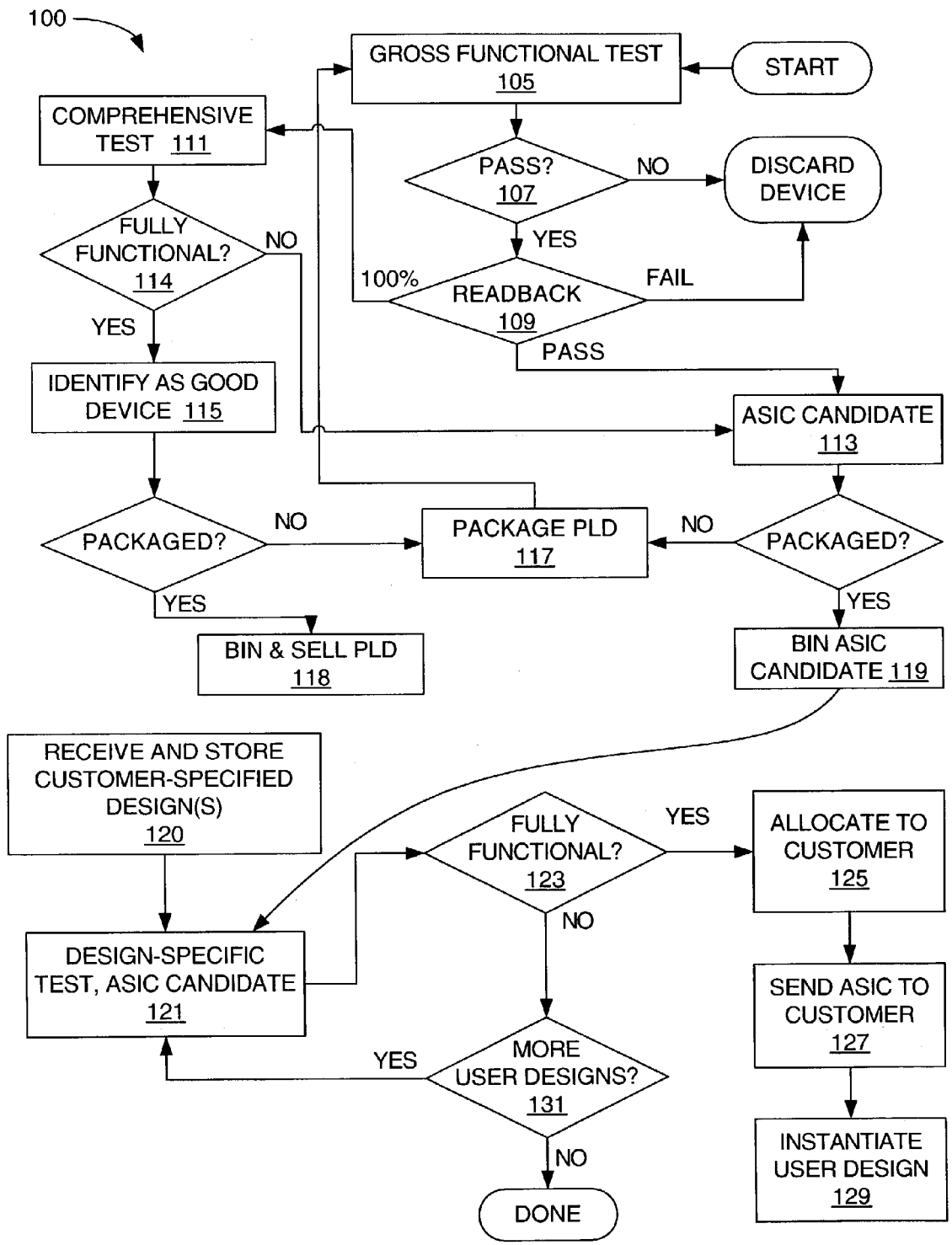
FIG. 1 is a flow chart 100 showing one embodiment of the present invention as applied to an FPGA.

FIG. 1 is a flowchart 100 showing a test method in accordance with one embodiment, as applied to an FPGA. The test method is carried out in software that can be stored on any computer-readable medium. Examples of computer-readable media include magnetic and optical storage media and semiconductor memory. The software and related test hardware is adapted to carry out a test sequence that identifies ICs that, despite minor defects, might nevertheless be suitable for implementing selected customer designs.

Subsequent to fabrication, the various FPGA die on a given semiconductor wafer are tested for gross defects (step 105). So-called "gross" defects are defects that render a device unfit for any customer purpose. Examples of gross defects include power-supply shorts or opens, excessive leakage, defective clock-management circuitry, or significant numbers of defective memory cells. In some embodiments, defects associated with input/output blocks (IOBs) are considered gross defects. Die with gross defects are discarded (decision 107). Many suitable methods of testing ICs, including programmable logic devices, are well known to those of skill in the art. Various exemplary tests for gross defects are described in chapter 14 of "Application-Specific Integrated Circuits," by Michael John Sebastian Smith (1997), which is incorporated herein by reference.

Die that survive decision 107 are subjected to a "readback test" to verify the function of the configuration memory cells (decision 109). In this step, configuration memory is programmed to include various patterns of configuration data and then read back to verify the correct program states of those cells. In one embodiment, die are rejected if they have a large number or concentration of defects. The number considered "large" will depend upon the size of the PLD in question and the distribution of the defects, as these parameters determine the likelihood of such defects rendering a PLD useless for instantiating customer designs (also referred to as "user designs").

At decision 109, defective die with greater than the maximum allowable number of defects are discarded, die with no defects are sent on to step 111 for comprehensive testing, and defective die with a number of defects less than the maximum allowed number are identified as "ASIC candidates" (step 113). ASIC candidates are those die that, though imperfect, may have adequate resources to instantiate some user designs. Other embodiments might separate ASTC candidates based on their likelihood of success at implementing a user design. For example, a device with only one defect might be considered more valuable than a device with five defects.

Devices having no identified defects through decision 109 are thoroughly tested to ensure conformance to strict performance specifications. Circuit vendors must verify, functionality, timing, speed performance, and other parameters of each device. Fully functional die are identified as good devices (step 115). These die are then packaged (step 117) and the resulting packaged parts subjected to the same series of tests as were the die, beginning once again at step 105. The tests are run again to ensure no defects were introduced by or during the packaging process. If a packaged die is defect free, the process eventually returns to step 115 and the packaged PLD is binned accordingly and, eventually, sold to a customer (step 118). Although not shown, the conventional test process for PLDs additionally includes speed binning.

Die that are less than fully functional but nevertheless survive decisions 107 and 109 are identified as "ASIC candidates" (step 113). Unpackaged ASIC candidates are packaged (step 117) and the resulting packaged PLDs are subjected to the same series of tests as were the die, beginning again at step 105. Each packaged die may be discarded by decisions 107 or 109, or may be identified once again as an ASIC candidate (step 113). This time, however, the packaged device is binned as a packaged ASIC candidate (step 119) to be tested to determine whether, despite imperfections, the ASIC candidate will reliably implement one or more specific user designs.

At some time prior to the next step in the illustrated test method, the PLD manufacturer receives one or more user designs expressed using the appropriate PLD design software (step 120). The received design expressions, typically netlists, are stored for later use in performing design-specific tests.

Design expressions of interest are matched with ASIC-candidate PLDS of the appropriate type (e.g., PLDs with the size and pin configuration appropriate for the design expressions). A first of these customer design expressions is then analyzed to create design-specific test expressions designed to instantiate design-specific test circuits on one of the ASIC candidates of step 119. These test circuits are used to determine whether the ASIC candidate functions with the customer design. Such functionality is not unlikely, as customer designs typically leave a substantial portion of their programmable resources unused, and the defects in the PLD may be limited to these unused portions. Test 121, a series of design-specific tests, is detailed below in connection with FIGS. 3–6.

In decision 123, if the ASIC candidate under test is fully functional with the design of interest, the device is identified as acceptable for use with the particular design (step 125). The device is eventually sent to the customer (step 127), who then programs the ASIC candidate with the design expression used in step 121 (step 129). Alternatively, if the design of interest is not fully functional in the selected device, one or more additional user designs may be tried (decision 131). The process is finished when the device is allocated for use with at least one specific user design or the user designs are exhausted. If no suitable design is found the ASIC candidate might be discarded or saved for testing on later received user designs. An ASIC candidate might be discarded after, for example, ten failed attempts to instantiate different user designs.

ASIC candidates allocated to a selected customer design are labeled accordingly to ensure they are not used in applications that may require defective resources. ASIC candidates may also be adapted to reject any but the verified user design. For example, a unique signature, such as a cyclic-redundancy-check (CRC) value of the bitstream for the verified design, may be stored in non-volatile memory on the PLD and used to verify the design. U.S. patent application Ser. No. 10/199,535 entitled "METHODS AND CIRCUITS FOR LIMITING A PROGRAMMABLE LOGIC DEVICE FOR USE WITH SPECIFIC DESIGNS," by Stephen M. Trimberger, describes methods for dedicating a PLD for use with one or more specific user designs, and is incorporated herein by reference.

In conventional testing, many PLDS are rejected for having a small number of random defects. Identifying ones of these that may nevertheless function perfectly with specific user designs allows PLD manufacturers and their customers to benefit from the use of PLDs that would otherwise be wasted. PLD manufactures benefit from significantly improved yield, and PLD customers benefit because PLDs suitable for their particular purpose are available at a lower price. Also advantageous from the user perspective, the recovered PLDs are physically and functionally identical to the fully functional PLDs first used to bring their products to market, so there are no engineering resources otherwise required to adapt their product to a new ASIC. The time normally required to adapt a product to a new ASIC is also reduced, allowing customers to move more quickly to a less expensive alternative to fully functional PLDs.

Flowchart 100 is illustrative; in practice, the flow may be quite different, with different steps accomplished in different orders and/or at different times. For example, step 121 may be performed using different test equipment than that used to verify "defect free" PLDs. Moreover, flowchart 100 illustrates the case in which each wafer may provide PLDs and ASIC candidates. In other embodiments, wafers may be dedicated entirely to PLDs or entirely to ASIC candidates. PLD yield and the customer demand for ASIC candidates will be considered in determining the proportion of wafers or die allocated to ASIC candidates.

Figure 2:
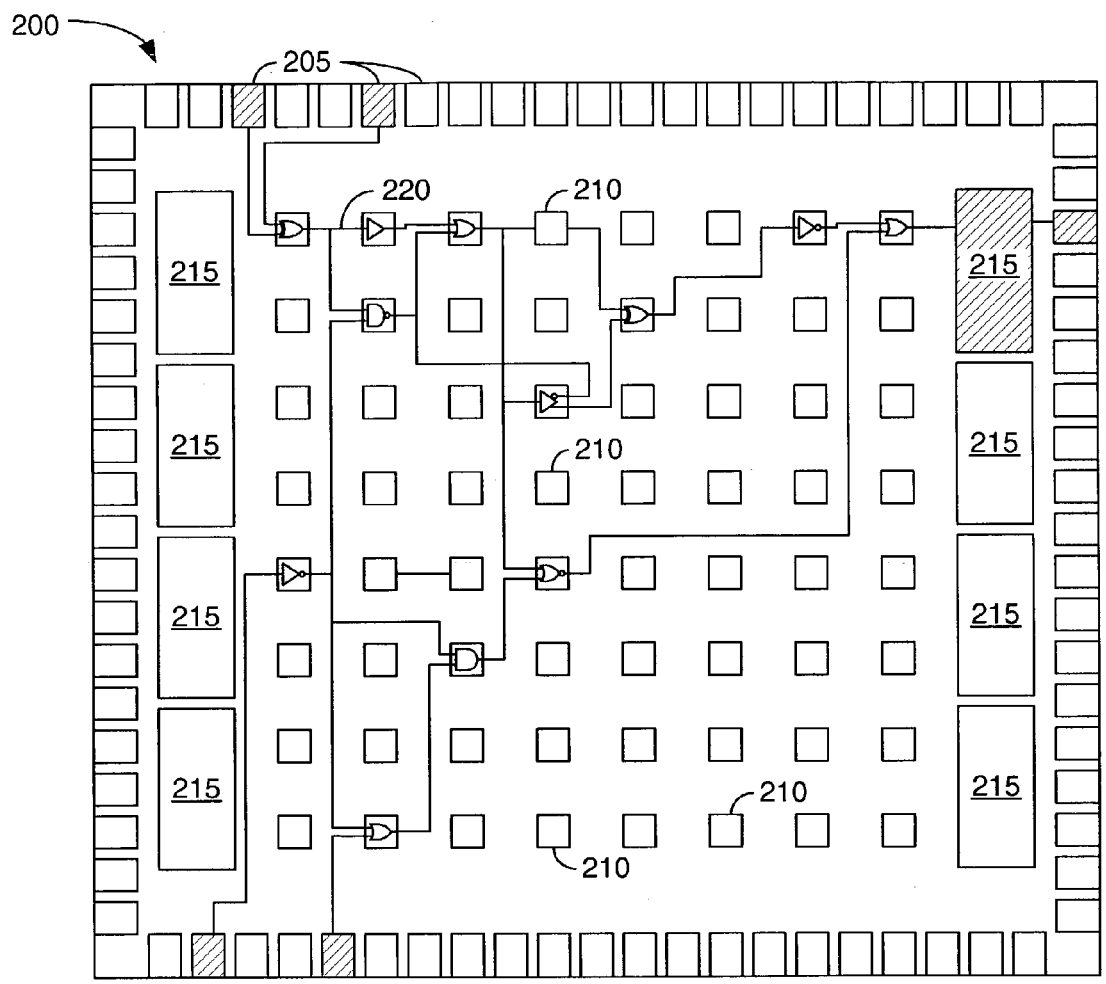
FIG. 2 is a block diagram of a conventional FPGA 200 in which is instantiated an illustrative user design.

FIG. 2 is a block diagram of a conventional FPGA 200 in which is instantiated an illustrative user design. FPGA 200 includes a collection of programmable logic, including a plurality of input/output blocks (IOBs) 205, an array of configurable logic blocks (CLBs) 210, and a plurality of RAM blocks 215, all of which may be selectively interconnected via programmable routing resources.

CLBs 210 are the primary building blocks and contain elements for implementing customizable gates, flip-flops, and wiring; IOBs 205 provide circuitry for communicating signals with external devices; and RAM blocks 215 allow for synchronous or asynchronous data storage, though each CLB can also implement synchronous or asynchronous RAMs. The programmable routing resources interconnect the various elements, forming a plurality of signal nets 220. For a detailed treatment of one FPGA, see pages 1–39 of the Xilinx advance product specification entitled "Virtex-II 1.5V Field-Programmable Gate Arrays," DS031-2 (v1.9), Nov. 29, 2001, which is incorporated herein by reference.

While illustrated with respect to an FPGA architecture, the test procedures discussed herein are equally applicable to other types of PLDs. In general, high-density PLD architectures include a number of programmable logic elements and some programmable routing resources. Programmable logic elements have many forms and many names, such as CLBs, logic blocks, logic array blocks, macrocells, logic cells, functional blocks. Programmable routing resources also have many forms and many names. Embodiments of the invention simplify design-specific testing by separately testing the logic elements and interconnect resources required for a given design.

Figure 3:
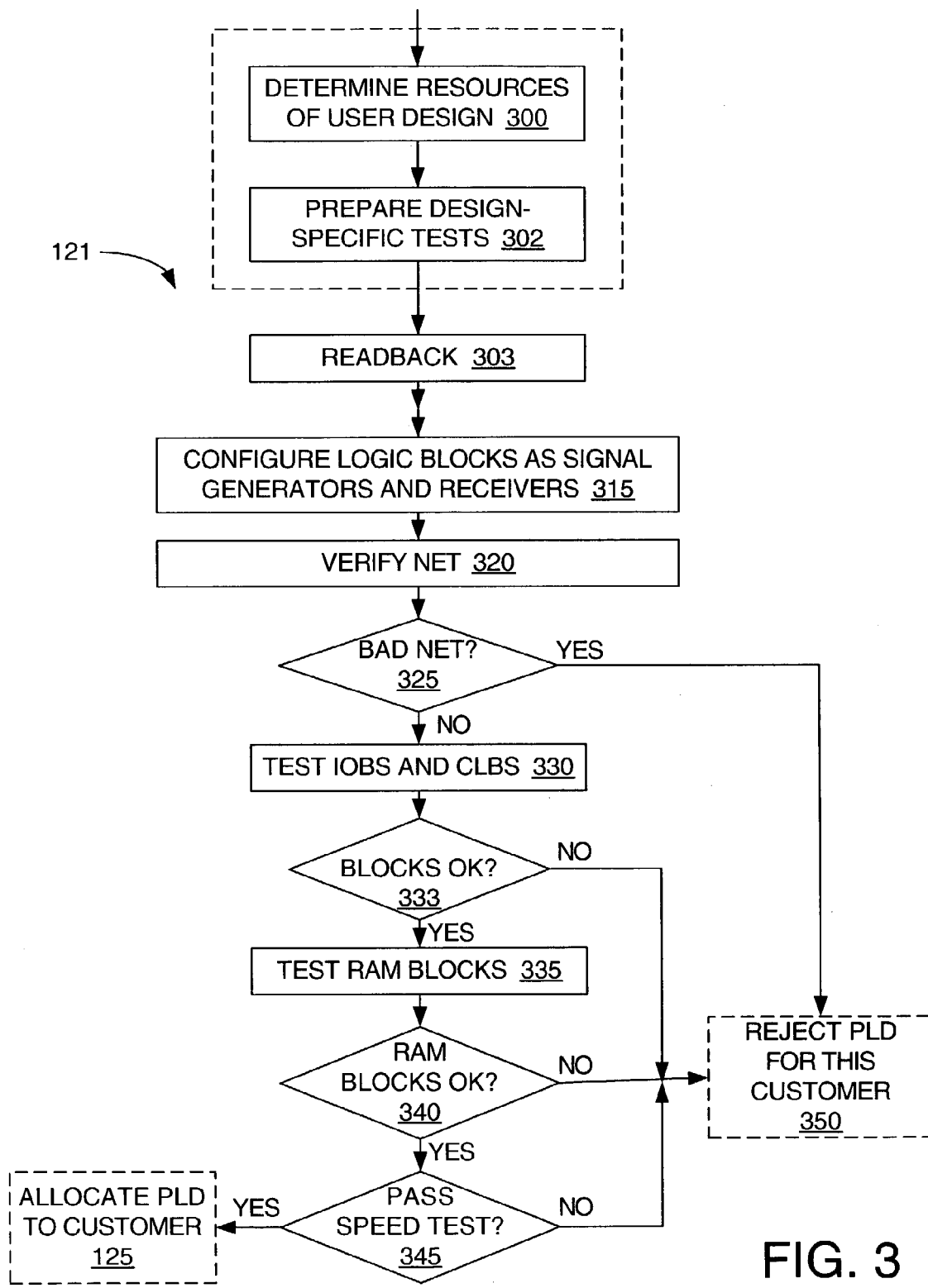
FIG. 3 is a flowchart detailing a portion of the design-specific test step 121 of FIG. 1.

FIG. 3 is a flowchart detailing a portion of the design-specific test step 121 of FIG. 1. Part of the test sequence of FIG. 3 is detailed in U.S. patent application Ser. No. 10/104,324 entitled "APPLICATION—SPECIFIC TESTING METHODS FOR PROGRAMMABLE LOGIC DEVICES," by Wells et al., which is incorporated herein by reference. The present application describes novel methods for testing configurable logic blocks and interconnect resources, so the following discussion focuses on those portions of the test flow of FIG. 3.

To begin with, software analyzes the user design to identify the resources required for the design (step 300). Such resources are depicted in the fictional example of FIG. 2 as the shaded IOBs 205, the CLBs 210 that include randomly selected logic symbols, a shaded RAM block 215, and nets 220 used to interconnect them (the remaining interconnect resources are omitted here for clarity). A given user design might additionally include carry logic, registers, sum-of-products logic, tri-state buffers, microprocessors, and clock-management circuitry, to name just a few possibilities. Also included but not shown are the programmable memory cells required to define the user configuration. The depicted configuration is a simple logic circuit intended only for illustration; practical logic circuits in conventional FPGAs are typically far more complex.

In step 302, test methodologies are prepared for each required resource identified in step 300. Some of the test methodologies are conventional, such as those used to test block RAM. Other methodologies, detailed below, allow test engineers to forego the complex and expensive task of developing design-specific tests. These methodologies specifically address interconnect resources and logic-block (e.g., CLB) functionality.

Design-Specific Test Configurations: Interconnect Resources

The test software of step 302 divides the interconnect resources specified in the user design into the required set of nets 220. As used herein, a "net" is a subset of the programmable interconnect resources programmed to extend between source and destination nodes. A number of sample nets are depicted in FIG. 2 using bold lines. In general, each net includes one signal source and one or more signal destination. The collection of nets together includes all signal paths defined by the user design, and the nets used for test are selected to minimize overlap.

Figure 4:
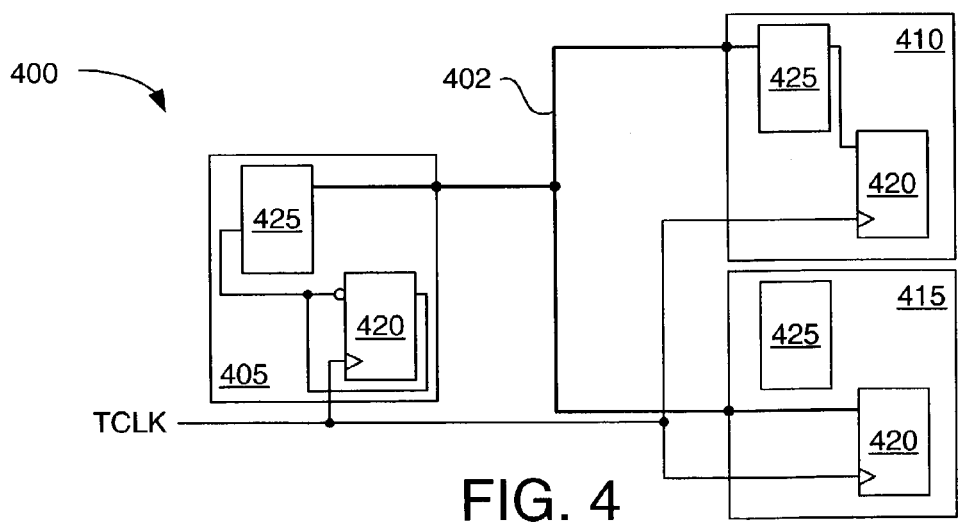
FIG. 4 depicts an exemplary net under test 400 and associated signal source 405 and destination circuits 410 and 415.

FIG. 4 depicts a test circuit 400 that can be generated automatically, in accordance with one embodiment, to test the integrity of a net 402 extracted from a user design. A signal source 405 and destination circuits 410 and 415 are substituted for the logic specific to the user design from which net 402 was extracted. Source 405 and circuits 410 and 415 are CLBs in the example, but each element might also be e.g. an IOB or a RAM block. In the example, source 405 is configured as a general-purpose test-signal generator that produces a sequence of ones and zeros in response to a test clock TCLK. Source 405 includes a flip-flop 420 connected through a look-up table (LUT) 425 to net 402. Source 405 need not include LUT 425, but this example assumes the portion of net 400 within the CLB used to instantiate source 405 is a portion of the user design. If the interconnect in the user design instead extended directly from flip-flop 420, then the preferred simulated net would similarly extend directly from flip-flop 420.

Destination circuits 410 and 415 are general-purpose test-signal observers. Each includes a respective LUT 425 and flip-flop 420. Flip-flops 420 are adapted to store signals presented to destinations 410 and 415 over net 402. To test net 402 on a device of interest, test circuit 400 is first instantiated on the device. Signals from source 405 are then clocked across net 402 into destination circuits 410 and 415 using test clock TCLK. The resulting contents of the flip-flops 420 in destination circuits 410 and 415 are then read back to ensure net 402 passed the correct data. The portions of net 402 that extend within destinations 410 and 415 are preferably the same portions employed by the user design. In the example, the user design includes local routing within destination 410 that conveys a signal to the respective LUT 425 and local routing within destination 415 that conveys a signal to the respective flip-flop 420.

The programming process used to generate the configuration data defining the various test circuits, including the test-signal generators and observers, typically utilizes design entry software (e.g., synthesis or schematic tools), placeand-route software, and bitstream generation software executed on a personal computer or workstation. The software includes a library of pre-defined circuit "macros" that define the test-signal generator and observer logic functions for each type of programmable block in a given PLD type. The use of "macros" in PLD programming processes is well known.

Programmable blocks (e.g., IOBS, CLBS, and RAM) typically include memory elements and local routing (FIG. 7, discussed below, details a conventional CLB). In verifying the routing path between programmable blocks in a given customer design, it is preferred that the local routing within the blocks be the same local routing used in the customer design. Consequently, the macros used to instantiate test-signal generators and receivers include, where possible, internal routing identical to their counterparts in the customer design.

In one embodiment, a library of software macros includes, for each type of logic block, a set of signal generators and observers that includes every possible configuration of local interconnect resources. Providing a test circuit for a net in a customer design then includes selecting test-signal generator and observer library elements whose local interconnect configurations best match the corresponding logic-block configurations in the customer design.

Some programmable resources may be difficult to test using the types of signal generators and observers described above. It may be difficult, for example, to create a toggle flip-flop that includes the carry chain resources available in some CLBs. In such cases, the logic block that cannot be effectively modeled as a signal generator and/or signal observer is instead instantiated between two other logic blocks, one of which is configured as a test-signal generator, the other of which is configured as a test-signal observer. In this instance, the intermediate logic block becomes a portion of the net connecting two other logic blocks.

Design-Specific Test Configurations: Logic Blocks

Also in step 302 (FIG. 3), the test software also develops test methodologies for the various CLBs 210 employed in the user design (e.g., the shaded CLBs 210 of FIG. 2). The design expression of interest is analyzed to determine what logical operation is to be provided by each CLB in the customer design. PLD design software then generates a design-specific expression of a test circuit to be instantiated on the PLD under test to verify the logical operations performed within each CLB in the design of interest.

Figure 5:
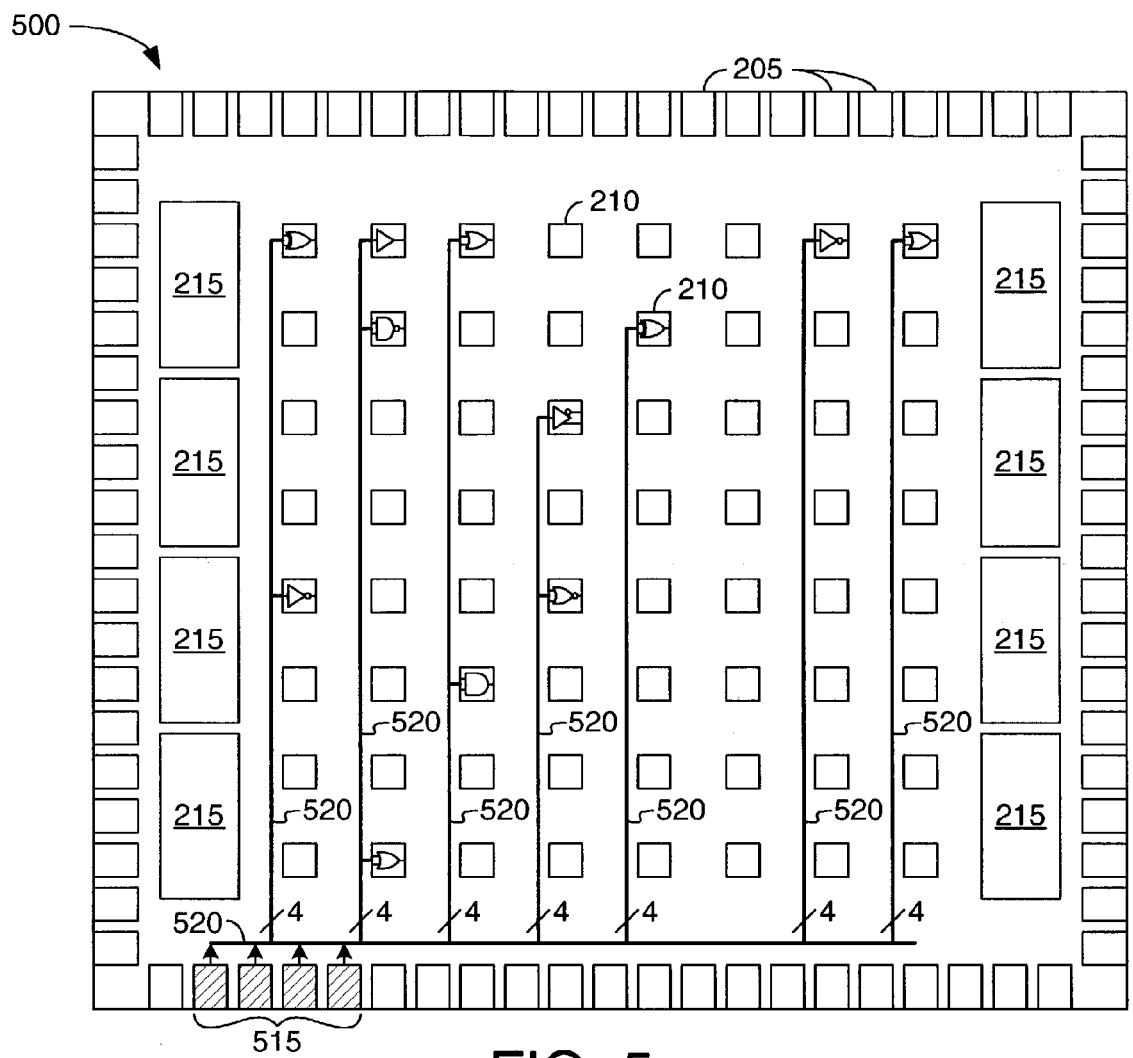
FIG. 5 depicts an FPGA 500 configured using an example test expression to include test configuration for verifying CLB suitability for a design of interest.

FIG. 5 depicts an FPGA 500 configured to include a test circuit that can be generated automatically, in accordance with one embodiment, to test the suitability of potentially defective CLBs for use in a design of interest. FPGA 500 is identical to FPGA 200 of FIG. 2, like-named elements being the same.

FPGA 500 illustrates a configuration in which each CLB 210 employed in the design of interest (the same illustrative design discussed in connection with FIG. 2) is programmed to perform the logical operation required in that design. The CLBs 210 of FPGA 500 are the same ones depicted in FIG. 2 as including randomly selected logic-gate symbols. The test configuration differs from that of the customer design in that nets 220 are eliminated; instead, the CLBs of the customer design are connected in parallel to four I/O pins 515 via a common bus 520. The test expression derived from the expression of the user design defines the depicted configuration.

To test the CLBs required for the user design, the configuration of FPGA 500 is instantiated on a device being tested for suitability with the user design. In a device so configured, pins 515 connect bus 520 to a signal generator (not shown) capable of producing every possible combination of input signals for each CLB. The four-line example assumes, for simplicity, that each CLB is capable of providing logic functions of up to four binary input signals; however, conventional logic blocks can logically combine more or fewer input signals.

Figure 6:
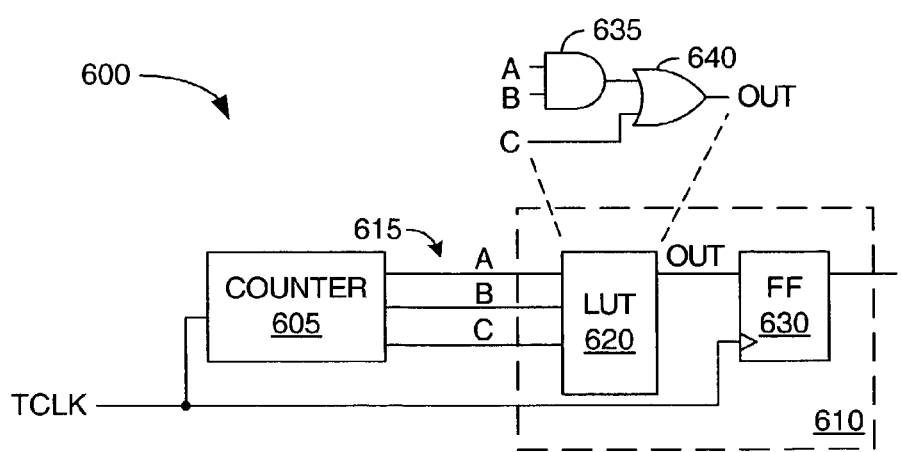
FIG. 6 depicts a simplified, single-CLB example of a test configuration 600 of the type shown in FIG. 5.

FIG. 6 depicts a simplified, single-CLB example of a test configuration 600 of the type shown in FIG. 5. Configuration 600 includes a counter 605 connected to a CLB 610 via a three-line bus 615. CLB 610 conventionally includes a look-up table (LUT) 620 and an output flip-flop 630. Conventional CLBs include many additional resources that have been omitted here for brevity. Some such resources are discussed below in connection with FIG. 7.

LUT 620, capable of providing any logic function of up to three input signals, is configured to perform a random function illustrated as a pair of interconnected gates 635 and 640 (a three-input example is used here for simplicity). As is well known, logic functions can be specified using "truth tables." The truth table for the combination of gates 635 and 640, and consequently for LUT 620 when configured to instantiate the logic function of gates 635 and 640, is provided below in Truth Table 1.

| TRUTH TABLE 1 | |
|---|---|
| COUNT (A, B, C) | OUT |
| 0 0 0 | 0 |
| 0 0 1 | 1 |
| 0 1 0 | 0 |
| 0 1 1 | 1 |
| 1 0 0 | 0 |
| 1 0 1 | 1 |
| 1 1 0 | 1 |
| 1 1 1 | 1 |

The foregoing truth table is easily extracted from a PLD design expression that specifies a LUT programmed to perform the logical operation symbolized using gates 635 and 640. Truth tables expressing the logical operation of each CLB in a given design can similarly be extracted. One design-specific test in accordance with an embodiment of the invention takes advantage of such extracted data to verify the logical function provided by each CLB. In the example of FIG. 6, counter 605 steps through each of the 2³ (eight) possible combinations of input signals to LUT 620 and, for each count, verifies that LUT 620 provides the appropriate output signal. In other words, counter 605 provides the counts depicted in truth table 1, above, and verifies each of the corresponding eight output signals.

System 600 employs flip-flop 630 to store the output of LUT 620 for each count, though this is not necessarily required. For CLBs that use flip-flop 630 in the desired customer design, incorporating flip-flop 630 provides a more exhaustive test. Flip-flop 630 may also be used to advantage in CLBs that do not require a flip-flop in the customer design of interest because flip-flop 630 provides a convenient means of storing and reading LUT output signals. Many logic elements (e.g., each configured CLB 210 of FIG. 5) can be tested in parallel to reduce test time.

These tests focus the inquiry on the resources required by the customer design of interest, and so do not often reject devices based on failing resources that are not relevant to a customer design. It does not matter, for example, whether LUT 620 produces the correct output levels when programmed to perform logic functions other than that required by the design of interest.

Design-Specific Test Configurations: Other Resources

Many methods for testing IC resources, including those of PLDs, are well known to those of skill in the art. Any of these methods may be used in accordance with embodiments of the invention to test the remaining resources. The aforementioned methods for testing nets and logic blocks are preferred in some cases, however, as they advantageously reduce the time required to verify the suitability of nets and CLBs for use with specific designs.

Returning to FIG. 3 and having developed the collection of design-specific tests described in connection with FIGS. 4, 5, and 6, the configuration bits required for the user design are written to and read from to verify those resources in the ASIC candidate (step 303). Recall from the discussion of FIG. 1 that ASIC candidates may have a few defective configuration-memory bits: step 303 ensures that any such defective bits do not impact the specific user design.

Next, steps 315 and 320 are repeated for each required net using test configurations of the type described in connection with FIG. 4. The source element of a given net is first configured as a signal generator and the destination element (or elements) is configured as a signal observer (step 315). The selected signal generator then provides signals to the respective destination circuit over the net to confirm the functionality of the net (step 320). Steps 315 and 320 repeat for each net of the user design until either a bad net is identified, in which case the ASIC candidate is rejected (decision 325 leading to step 350), or all the nets pass, in which case the test moves to step 330 to test the IOBs and CLBs specific to the user design. Collections of nets can be tested in parallel, where possible, to save time. If one or more nets fail, the ASIC candidate is rejected for use with the design used to develop the test configurations; otherwise, the next step 330 test the IOBs and CLBS.

Some embodiments of the invention perform further testing of the nets to locate shorts between interconnect resources that might impact a customer design. In one embodiment, for example, each net is tested with neighboring interconnect resources held high (e.g., to a logic one). A short between the net under test and a neighboring interconnect line will corrupt the data transmitted over the net. The test can be repeated with neighboring resources held to a logic zero. Such testing can be accomplished using design-specific test circuits defined during step 302 for a particular user design.

Dividing the interconnect into a collection of nets is only one way to test the interconnect resources associated with a given design. For other methods of testing interconnect resources, see e.g. pending U.S. patent application Ser. No. 09/837,380 entitled "PROVIDING FAULT COVERAGE OF INTERCONNECT IN AN FPGA," by Robert W. Wells, et al., which is incorporated herein by reference.

Returning again to FIG. 3, step 330 applies the test configurations discussed above in connection with FIGS. 4 and 5 to test the IOBs and CLBS. In the example of FIG. 5, each CLB 210 under test is configured to perform the requisite user logic and connected to a counter (not shown) via bus 520 and I/O pins 515. The counter then steps through each of the $2^4$ (sixteen) possible input combinations. A readback operation is performed on FPGA 500 after each count to determine whether the appropriate value is stored within the various flip-flops (like flip-flop 630 of FIG. 6) in the CLBS under test. If each CLB produces the required output signal for each combination of test signals, then the CLBs meet the logic requirements of the customer design. The test procedure is hastened by testing as many CLBs in parallel as possible. Additional conventional tests can be performed on the IOBs and CLBs to enhance the coverage of the above-identified procedures.

If one or more CLBs or IOBs fails (decision 333), the ASIC candidate is rejected for use with the design used to develop the test configurations; otherwise, the next step 335 tests the RAM blocks. In some FPGAs, CLBs can be configured as RAM. In such cases, any CLBs of the customer design that will be used as RAM are treated to the same types of tests that the RAM blocks are subjected to. Any of a number of well-know RAM testing strategies may be used in step 335.

Should any of the RAM fail, the test rejects the ASIC candidate for use with the present user design; if all the RAM passes, the ASIC candidate may be subjected to one or more parametric tests that verify the speed performance for signals traversing critical paths in the user circuit of interest. For discussions of methods of performance testing PLDs, U.S. Pat. Nos. 6,075,418 and 6,232,845, both to Kingsley, et al., and the above-incorporated Smith reference. Both Kinsley et al. patents are incorporated herein by reference.

Using the test procedures outlined in the Kingsley et al. patents, collections of configurable resources are configured in a loop so that they together form a free-running ring oscillator. The oscillator produces an oscillating test signal in which the period is proportional to the speed of the components in the loop. Many such oscillators can be instantiated on a given PLD to measure speed performance. In some embodiments, ASIC candidates can be tested using the methods and circuits described in the above-noted patents to Kingsley et al. The resources used in the customer design can be tested for speed, or more exhaustive speed testing can be done before or after design-specific testing. In one embodiment, oscillators of the types described by Kingsley et al. are distributed across the PLD to test for speed. Some oscillators may not function at all due to the defects present in ASIC candidates. These oscillators are, in some embodiments, simply disregarded: the other tests outlined above ensure the defects do not impact customer designs.

If the PLD fails the speed test (decision 345), then the test rejects the PLD for use with the present user design and attempts another user design, if any. Otherwise, the ASIC candidate is deemed fit for use with the user's design, and is consequently allocated for sale to the appropriate customer (step 125).

In addition to the tests described above, ASIC candidates can be subjected to the same types of physical and reliability testing as the equivalent standard PLDs. Holding defective parts to high standards for specific customer designs may be important for encouraging customers to use the type of ASIC candidates identified using the above methods.

For ease of illustration, flowcharts 100 and 300 treat steps 300 and 302 as part of the overall test sequence of flowchart 100. In practice, steps 300 and 302 are not part of a test sequence, but are instead carried out for a given user design and then applied to appropriate ASIC candidates.

Figure 7:
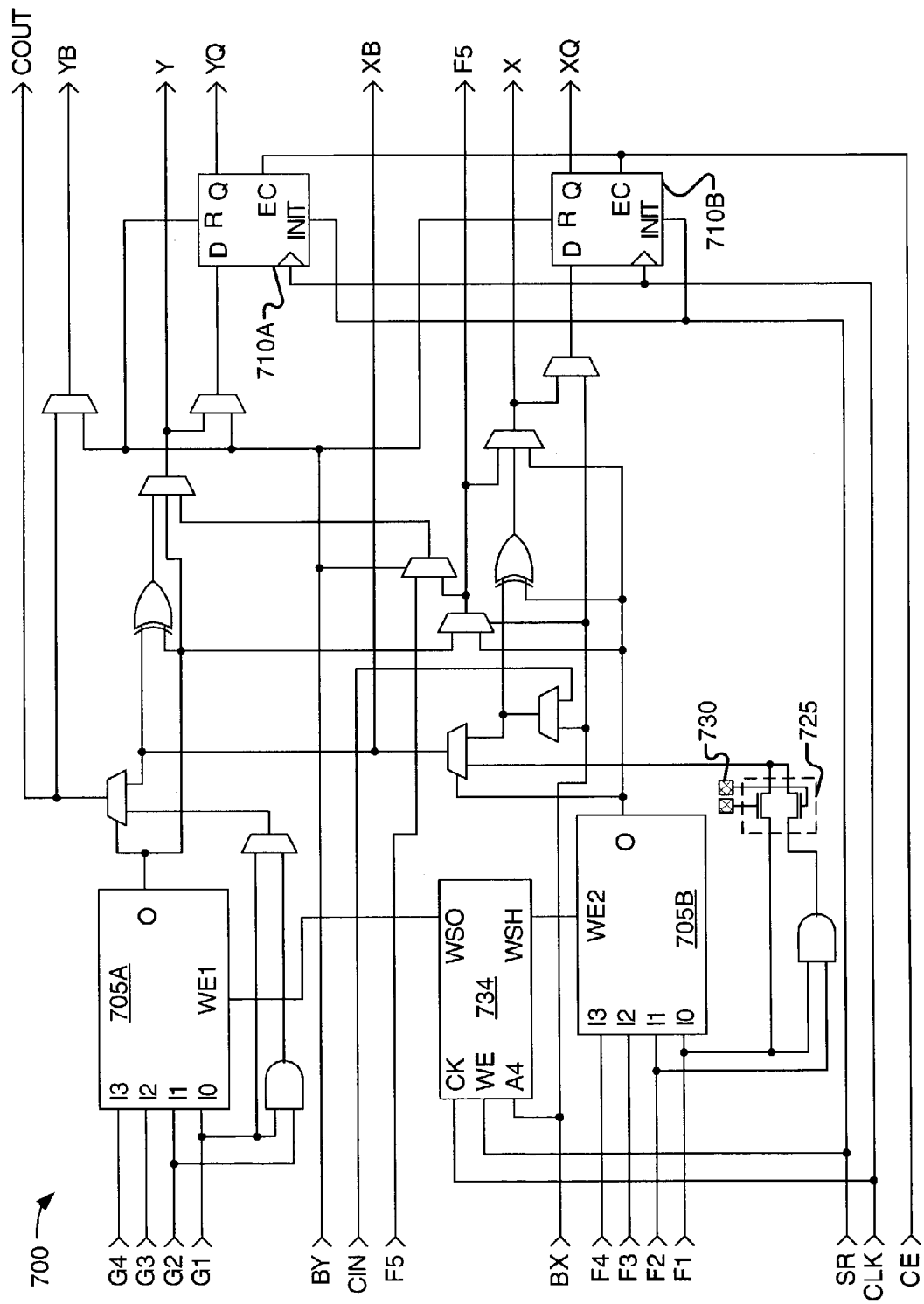
FIG. 7 (prior art) is a schematic diagram of a "slice" 700, one of two identical slices that make up an exemplary CLB in the Virtex™ family of devices available from Xilinx, Inc.

FIG. 7 (prior art) is a schematic diagram of a "slice" 700, one of two identical slices that make up an exemplary CLB in the Virtex™ family of devices available from Xilinx, Inc. All of the terminals to and from slice 700 are connected to horizontal or vertical interconnect lines (not shown) through which they can be programmably connected to various other components within the FPGA.

Slice 700 includes two 4-input LUTs 705A and 705B. LUTs 705A and 705B are each capable of implementing any arbitrarily defined Boolean function of up to four inputs. In addition, each of LUTs 705A and 705B can provide a 16×1-bit synchronous RAM. Furthermore, the two LUTs can be combined to create a 16×2-bit or 32×1-bit synchronous RAM, or a 16×1-bit dual-port synchronous RAM.

Slice 700 also includes a pair of sequential storage elements 710A and 710B that can be configured either as edge-triggered D-type flip-flops or as level-sensitive latches. The D inputs can be driven either by LUTs 705A and 705B or directly from input terminals, bypassing LUTs 705A and 705B. Each storage element includes an initialization terminal INIT, a reverse-initialization terminal R, an enable-clock terminal EC, and a clock terminal conventionally designated using the symbol ">". The INIT terminal forces the associated storage element into an initialization state specified during configuration; the reverse-initialization terminal R forces the storage element in the opposite state as the INIT terminal. Terminals INIT and R can be configured to be synchronous or asynchronous, and the sense of each control input can be independently inverted.

Configuration memory cells define the functions of the various configurable elements of slice 700. An exemplary two-input multiplexer 725 includes a pair of MOS transistors having gate terminals connected to respective configuration memory cells 730. Other configuration memory cells used to define the functions of the remaining programmable elements of slice 700 are omitted for brevity. The use of configuration memory cells to define the function of programmable logic devices is well understood in the art.

A detailed discussion of slice 700 is not necessary for understanding the present invention, and is therefore omitted for brevity. For a more detailed treatment of the operation of many components within slice 700, see U.S. Pat. No. 6,427,156 entitled "Configurable Logic Block with AND Gate for Efficient Multiplication in FPGAs" by Kenneth D. Chapman and Steven P. Young, U.S. Pat. No. 5,889,413 entitled "Lookup Tables Which Double as Shift Registers" by Trevor J. Bauer, and U.S. Pat. No. 5,914,616, entitled "FPGA Repeatable Interconnect Structure with Hierarchical Interconnect Lines" by Steven P. Young, Kamal Chaudhary, and Trevor J. Bauer. Each of the foregoing documents is incorporated herein by reference.

Virtex™ FPGAs are fully compliant with the IEEE Standard 1149.1 Test Access Port and Boundary-Scan Architecture, commonly referred to as the "JTAG standard," or simply "JTAG." Using JTAG, FPGA resources can be field tested by importing a serial stimulus vector to program the FPGA to include the above-described test circuitry. Then, as described above, the test circuitry can be run at speed to determine whether the resources occupied by the test circuitry function properly at speed.

The invention is applicable to all device geometries and will continue to apply as device geometries continue to shrink. For example, the emerging technology of molecular electronics, or "molectronics," promises to provide integrated circuits of extraordinary density and speed performance. Molectronic systems are expected to include a far greater percentage of defective resources than contemporary devices. The above-described invention matches defective circuitry with circuit designs not impacted by the defects, and may therefore prove invaluable in bringing molectronic systems to market.

While the present invention has been described in connection with specific embodiments, variations of these embodiments will be obvious to those of ordinary skill in the art. For example, the foregoing test describes just a few ways to test programmable resources and circuits instantiated in programmable resources; many other test methods might also be used. Those of skill in testing PLDs can adapt many standard tests for use with the invention. Moreover, different types of PLDs include different types of logic elements and interconnect resources, but can nevertheless benefit from the above-described test methods. Therefore, the spirit and scope of the appended claims should not be limited to the foregoing description.

What is claimed is:

1. A method for testing a programmable logic device, wherein the programmable logic device includes programmable logic elements and programmable routing resources, the method comprising:
   a. storing an expression of a specific design adapted for instantiation on the programmable logic device, wherein the expression of the specific design specifies:
      i. a plurality of the programmable logic elements programmed to perform combinatorial logic operations; and
      ii. a plurality of interconnect lines programmed to define a first collection of nets interconnecting the plurality of programmable logic elements;
   b. determining, from the expression of the specific design, what logical operation is to be performed by each of the plurality of programmable logic elements specified by the expression of the specific design; and
   c. generating a test expression adapted for instantiation on the programmable logic device, wherein the test expression specifies:
      i. the logical operation to be performed by each of the plurality of programmable logic elements specified by the expression of the specific design; and
      ii. a second collection of nets different from the first collection of nets.

2. The method of claim 1, further comprising programming the programmable logic device using the test expression to instantiate a test circuit on the programmable logic device.

3. The method of claim 2, further comprising testing the test circuit to verify that each of the plurality of programmable logic elements specified by the test expression performs the correct logical operation.

4. The method of claim 3, wherein each of the programmable logic elements includes a plurality of input terminals, the method further comprising:
   a. connecting the input terminals of at least two of the programmable logic elements in parallel to a test bus;
   b. presenting combinations of logic levels on the test bus; and
   c. verifying, for each combination of logic levels, a correct output signal from each of the programmable logic elements programmable logic elements specified by the test expression.

5. The method of claim 4, further comprising connecting the test bus to a counter, wherein the counter generates the combinations of logic levels on the test bus.

6. The method of claim 4, wherein the combinations of logic levels are developed external to the programmable logic device.

7. The method of claim 1, further comprising validating the first collection of nets.

8. The method of claim 7, further comprising dedicating the programmable logic device for use with the specific design.

9. A method for testing a programmable logic device, wherein the programmable logic device includes programmable logic elements and programmable routing resources, the method comprising:
   a. storing an expression of a specific design adapted for instantiation on the programmable logic device, wherein the expression of the specific design specifies:
      i. a plurality of the programmable logic elements programmed to perform combinatorial logic operations; and
      ii. a plurality of interconnect lines programmed to define a first collection of nets interconnecting the plurality of programmable logic elements;
   b. programming the programmable logic device to interconnect the plurality of the programmable logic elements using the first collection of nets;
   c. testing the first collection of nets;
   d. programming the programmable logic device to interconnect the plurality of programmable logic elements using a second collection of nets different from the first collection of nets; and
   e. testing the plurality of programmable logic elements.

10. The method of claim 9, wherein the second collection of nets defines a test bus connected in parallel to ones of the plurality of programmable logic elements.

11. The method of claim 10, further comprising presenting combinations of logic levels on the test bus and verifying, for each combination of logic levels, a correct output signal from each of the programmable logic elements.

12. The method of claim 11, further comprising connecting the test bus to a counter, wherein the counter generates the combinations of logic levels on the test bus.

13. The method of claim 11, wherein the combinations of logic levels are developed external to the programmable logic device.

14. A computer-readable medium having computer-executable instructions for performing the steps of:
   a. storing an expression of a specific design adapted for instantiation on the programmable logic device, wherein the expression of the specific design specifies:
      i. a plurality of the programmable logic elements programmed to perform combinatorial logic operations; and
      ii. a plurality of interconnect lines programmed to define a first collection of nets interconnecting the plurality of programmable logic elements;
   b. programming the programmable logic device to interconnect the plurality of the programmable logic elements using the first collection of nets;
   c. testing the first collection of nets;
   d. programming the programmable logic device to interconnect the plurality of programmable logic elements using a second collection of nets different from the first collection of nets; and
   e. testing the plurality of programmable logic elements.

15. A method for testing a programmable logic device, wherein the programmable logic device includes programmable logic elements and programmable routing resources, the method comprising:
   a. storing an expression of a specific design adapted for instantiation on the programmable logic device, wherein the expression of the specific design specifies:
      i. a plurality of the programmable logic elements programmed to perform combinatorial logic operations; and
      ii. a plurality of interconnect lines programmed to define a first collection of nets interconnecting the plurality of programmable logic elements;
   b. determining, from the expression of the specific design, what logical operation is to be performed by each of the plurality of programmable logic elements specified by the expression of the specific design;
   c. generating a first test expression for instantiation on the programmable logic device, wherein the first test expression specifies:
      i. the plurality of programmable logic elements programmed to perform the combinatorial logic operations; and
      ii. a second collection of nets, different from the first collection of nets, for interconnecting the plurality of programmable logic elements; and
   d. programming the programmable logic device to instantiate a first test circuit derived from the first test expression.

16. The method of claim 15, further comprising:
   a. generating a second test expression for instantiation on the programmable logic device, wherein the second test expression specifies:
      i. the first collection of nets; and
      ii. the plurality of programmable logic elements programmed to perform test logic operations; and
   b. programming the programmable logic device to instantiate a second test circuit derived from the second test expression.

17. The method of claim 16, wherein the programmable logic elements are programmed as signal generators and signal observers.

18. The method of claim 15, wherein the programmable logic device includes at least one defect.

19. A method for testing a programmable logic device, wherein the programmable logic device includes programmable logic elements and programmable routing resources, the method comprising:
   a. storing an expression of a specific design adapted for instantiation on the programmable logic device, wherein the expression of the specific design specifies:
      i. a plurality of the programmable logic elements programmed to perform a collection of combinatorial logic operations; and
      ii. a plurality of interconnect lines programmed to define a collection of nets interconnecting the plurality of programmable logic elements;
   b. testing the collection of combinatorial logic operations instantiated on the programmable logic device via a common bus and in the absence of the collection of nets; and
   c. testing the collection of nets instantiated on the programmable logic device using signal source and destination circuits and in the absence of the combinatorial logic operations.

* * * * *